(12) United States Patent
May et al.

(10) Patent No.: US 7,081,773 B1
(45) Date of Patent: Jul. 25, 2006

(54) UPDATING CONFIGURATION FOR PROGRAMMABLE LOGIC DEVICE

(75) Inventors: Roger May, Bicester (GB); James Tyson, Slough (GB); Mark Dickinson, Aylesbury (GB)

(73) Assignee: Altera Corporation, San Jose, CA (US)

( * ) Notice: Subject to any disclaimer, the term of this patent is extended or adjusted under 35 U.S.C. 154(b) by 70 days.

(21) Appl. No.: 10/886,914

(22) Filed: Jul. 7, 2004

(51) Int. Cl.
*H03K 19/173* (2006.01)

(52) U.S. Cl. .......................................... 326/38; 326/41
(58) Field of Classification Search ............. 326/37–41
See application file for complete search history.

(56) References Cited

U.S. PATENT DOCUMENTS

| | | | |
|---|---|---|---|
| 5,548,228 A * | 8/1996 | Madurawe | 326/41 |
| 6,172,521 B1 * | 1/2001 | Motomura | 326/40 |
| 6,842,854 B1 * | 1/2005 | Nishihara et al. | 712/228 |
| 2005/0189962 A1 * | 9/2005 | Agrawal et al. | 326/41 |

\* cited by examiner

*Primary Examiner*—Don Le
(74) *Attorney, Agent, or Firm*—Townsend and Townsend and Crew LLP

(57) ABSTRACT

A programmable logic device is reconfigurable between two functionalities, while it is in use. The programmable logic device has a first store, into which configuration data may be downloaded from an external memory device, and a second store, in which a copy of the configuration data is maintained, with the functionality of the programmable logic device being determined by the copy of the configuration data, thereby allowing additional configuration data to be downloaded from the external memory device into the first store, while maintaining the functionality of the device. This allows the device to be used to provide two different functionalities, and to be switched between these two functionalities with minimal delay for reconfiguration of the device.

11 Claims, 4 Drawing Sheets

US 7,081,773 B1

UPDATING CONFIGURATION FOR PROGRAMMABLE LOGIC DEVICE

TECHNICAL FIELD OF THE INVENTION

This invention relates to a programmable logic device, and in particular to a programmable logic device which can be reconfigured while in use.

BACKGROUND OF THE INVENTION

Programmable logic devices are well known, having an array of programmable logic elements. The functionality of these logic elements, and their interconnections with the input/output blocks of the device, can be configured on the basis of configuration data.

Typically, the configuration data is stored in an external memory device, which is connected to the programmable logic device, and the configuration data is then downloaded into the programmable logic device. The programmable logic device is then configured on the basis of the downloaded configuration data, and the programmable logic device can perform its intended function.

One major advantage of programmable logic devices, compared with other ways of providing the same functionality, such as hard-wired integrated circuits, is that they can be reconfigured, either partially or wholly, after manufacture.

However, there remains the disadvantage that this reconfiguration occupies a time period, which may last for tens or hundreds of milliseconds, during which time the device may not be fully operational. For some applications, this reconfiguration time may be an obstacle to the intended use of the device.

SUMMARY OF THE INVENTION

An object of the present invention is therefore to provide a programmable logic device which can be reconfigured while in use, without disrupting the operation of the device.

A further object of the invention is to provide a programmable logic device, which is reconfigurable between two functionalities, while it is in use.

This invention relates to a programmable logic device, having a first store, into which configuration data may be downloaded from an external memory device, and having a second store, in which a copy of the configuration data is maintained, with the functionality of the programmable logic device being determined by the copy of the configuration data, thereby allowing additional configuration data to be downloaded from the external memory device into the first store, while maintaining the functionality of the device.

This allows the device to be used to provide two different functionalities, and to be switched between these two functionalities with minimal delay for reconfiguration of the device.

DETAILED DESCRIPTION OF PREFERRED EMBODIMENTS

Figure 1:
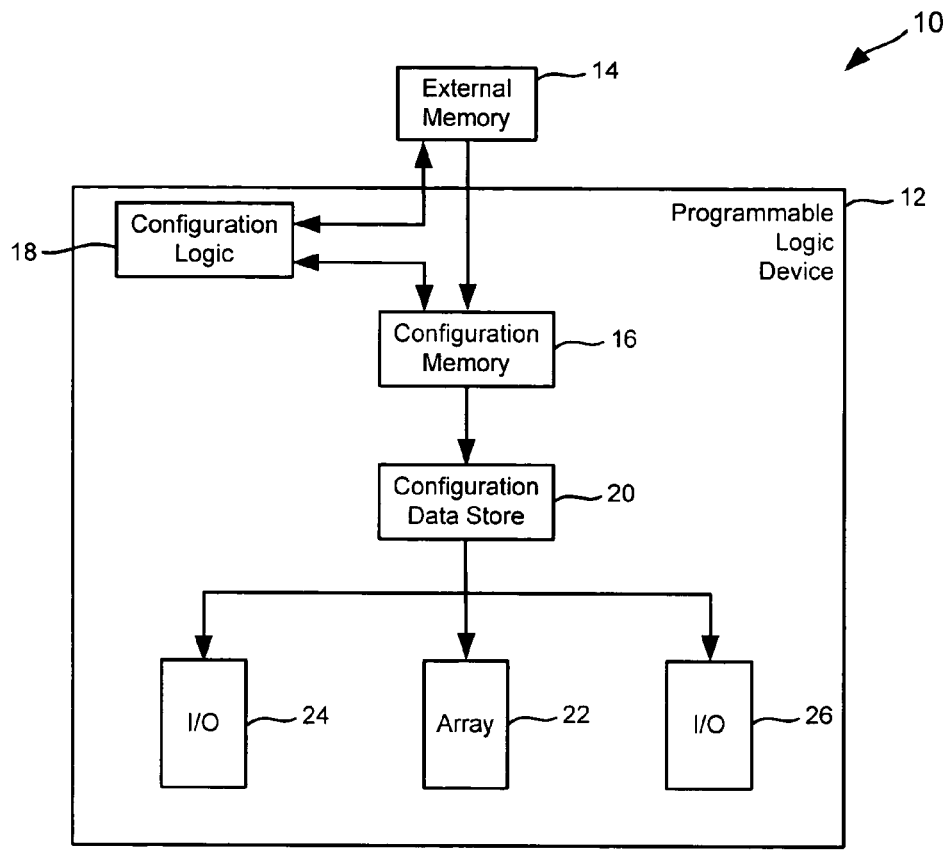
FIG. 1 is a block schematic diagram of a system in accordance with an aspect of the present invention.

FIG. 1 is a block schematic diagram of a digital system, incorporating a programmable logic device in accordance with the present invention.

Specifically, the system 10 includes an integrated circuit in the form of a programmable logic device 12, having a connection to an external memory device 14. The programmable logic device 12 includes a configuration memory 16, which downloads configuration data from the external memory device 14, under the control of a configuration logic block 18. In this illustrated embodiment, the external memory device 14 is in the form of a separate integrated circuit, although it could instead be in the form of an on-chip EEPROM or other memory device.

In accordance with the invention, the configuration data stored in the configuration memory 16 is also held in a configuration data store 20.

As is generally conventional, the programmable logic device 12 includes an array 22 of programmable logic elements, and input/output blocks 24, 26. The connections within the array 22, the connections made between the input/output devices 24, 26 and other external devices (not shown), and the interconnections between the programmable logic elements of the array 22 and the input/output devices 24, 26, are all dependent upon the configuration data which they receive from the configuration data store 20. Since it is these connections which determine the functionality of the device, it will be apparent that this functionality is dependent upon the data stored in the configuration data store 20.

One use of the present invention relates to a situation in which the functionality of the device is to be upgraded. That is, after the system 10 has been in use for a considerable period of time, it is decided to change or improve the functionality of the system in some way. This can therefore be achieved by removing the external memory device 14, containing the original configuration data, and replacing it by an alternative external memory device, containing different configuration data, although this would require particular care as the system would need to be powered down and reset. As will be described in more detail below, the present invention allows such a reconfiguration to be carried out more conveniently than in a conventional programmable logic device.

However, the advantages of the present invention are particularly relevant in a situation where the system 10 is intended to be used for two different functions. For example, the system 10 may form part of a mobile communications device, which is intended both to be usable for short range wireless communications (for example in accordance with IEEE Standard 802.11) for one part of the time, and to be usable for cellular wireless communications (for example in a third generation cellular system) for another part of the time.

In such a situation, it can be very convenient to provide this functionality by means of a programmable logic device, because the same piece of hardware can be used to provide the two different functionalities. All that is then required is for the external memory device 14 to contain the two sets of configuration data which the programmable logic device 12 requires in order to achieve those two functionalities.

In principle, when the system is required to switch between its two modes of operation, that is, the short range wireless communications and the cellular wireless communications in this example, a new set of configuration data can be downloaded from the external memory device 14 into the programmable logic device 12, which can then perform the functions defined by the new configuration data. However, in practice, downloading the data and reconfiguring the device can take some tens or hundreds of milliseconds. In the situation described above, where it is necessary for the user to maintain seamless communication with one or other of the available communications networks, this reconfiguration period may be too long to allow the system to be used successfully.

In accordance with the present invention, therefore, the configuration data downloaded from the external memory device 14 into the configuration memory 16 is also copied into the configuration data store 20, and it is the data stored in the configuration data store 20 which is used to determine the functionality of the device. At the same time, however, replacement configuration data can be downloaded from the external memory device 14 into the configuration memory 16, without disrupting the operation of the device, as determined by the configuration data stored in the configuration data store 20. At a time when it is desired to change the functionality of the system, the replacement configuration data can then be transferred into the configuration data store 20 from the configuration memory 16, and can thereafter be used to determine the functionality of the device.

As a result, the reconfiguration can be performed more quickly, and, in the case of the mobile communications device described above, it may be performed sufficiently quickly to allow a seamless transfer of communications from one network to another.

Figure 2:
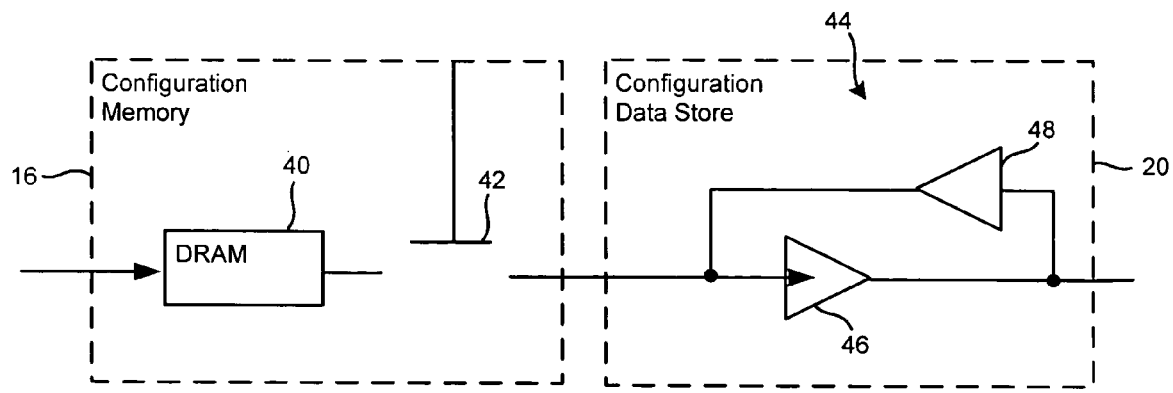
FIG. 2 is a block schematic diagram of a part of the programmable logic device in the system of FIG. 1.

FIG. 2 shows in more detail the structure of the configuration memory 16 and configuration data store 20, in one preferred embodiment of the present invention.

In the embodiment shown in FIG. 2, the configuration memory 16 is based around a Dynamic Random Access Memory (DRAM) cell 40. On the output of the DRAM cell 40, a switch 42 is controlled by a signal from the configuration logic block 18. When a configuration or reconfiguration of the device is required, the switch 42 is closed, allowing the output of the DRAM cell 40 to be supplied to the configuration data store 20. At other times, the switch 42 is open.

While the switch 42 is open, new configuration data can be loaded into the DRAM cell 40 from the external memory device 14, without affecting the configuration data stored in the configuration data store 20.

In the embodiment of FIG. 2, the configuration data store 20 is based around a bus keeper cell 44 for each bit of configuration data, although the bus keeper cell 44 can be replaced if desired by a SRAM cell. The bus keeper cell 44 includes a first buffer 46, having a second buffer 48 providing a weak feedback path around the first buffer 46. Thus, the data value on the output of the configuration data store 20 is unchanged, unless or until replacement configuration data is loaded into the configuration data store 20 from the configuration memory block 16.

Figure 3:
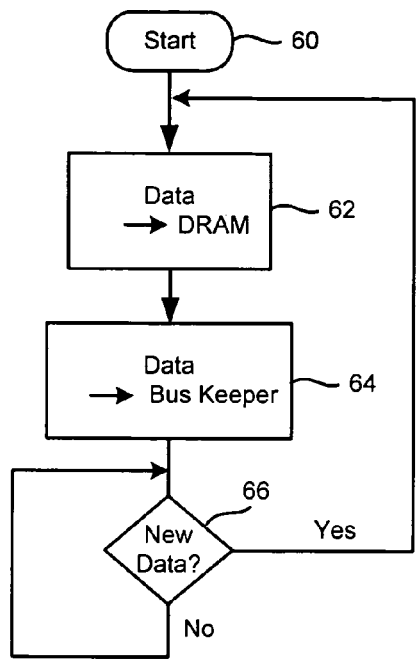
FIG. 3 is a flow chart illustrating the operation of the system of FIG. 2.

FIG. 3 is a flow chart showing a first method of operation of the embodiment shown in FIG. 2. The process begins in step 60 and, in step 62, data is loaded from the external memory device 14 into the DRAM cell 40. Under the control of the configuration logic block 18, the switch 42 is closed, and the data from the DRAM cell 40 is loaded into the bus keeper cell 44 in step 64 of the process. The device can then function on the basis of this configuration data.

In step 66 it is tested whether new data is available to be downloaded from the external memory device 14 into the DRAM 40. This test can be carried out by logic in an external processor, or by the configuration logic block 18, or by logic instantiated within the array 22.

If new data is not available, this step repeats until new data is available. When it is determined in step 66 that new data is available to be downloaded, the process returns to step 62, as described above.

This has the advantage that the new configuration data can be downloaded, without needing to disrupt the operation of the device on the basis of the configuration data stored in the bus keeper cell 44. Moreover, if it is not thought necessary to use the DRAM cell 40 to keep a copy of the configuration data, and if the new configuration data can be downloaded sufficiently quickly, there is no need to refresh this data in the DRAM cell 40. However, if these conditions do not apply, suitable refresh circuitry can be provided to refresh the data in the DRAM cell as required, as will be understood by the person of ordinary skilled in this technical field.

The embodiment shown in FIG. 2 therefore has the advantage that it allows new configuration data to be loaded into the device without disrupting its operation.

Figure 4:
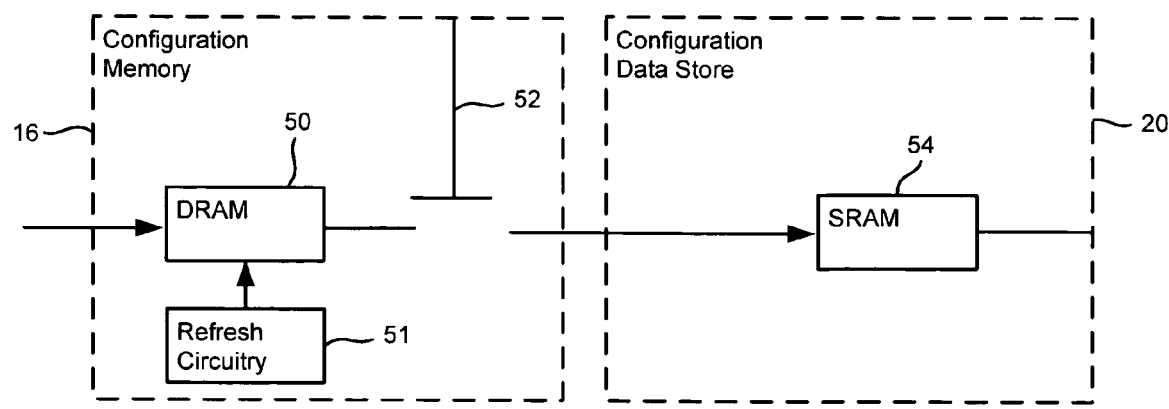
FIG. 4 shows an alternative form of the part of the programmable logic device in the system of FIG. 1.

FIG. 4 shows an alternative preferred embodiment of the present invention. In the embodiment of the FIG. 4, the configuration memory block 16 is based around a Dynamic Random Access Memory (DRAM) cell 50, having refresh circuitry 51. As before, a switch 52, controlled by the configuration logic block 18, is provided on the output of the DRAM cell 50, and this is connected to the configuration data store 20. In this case, the configuration data store 20 is based around a SRAM cell 54, although the SRAM cell 54 can be replaced if desired by a bus keeper cell.

Figure 5:
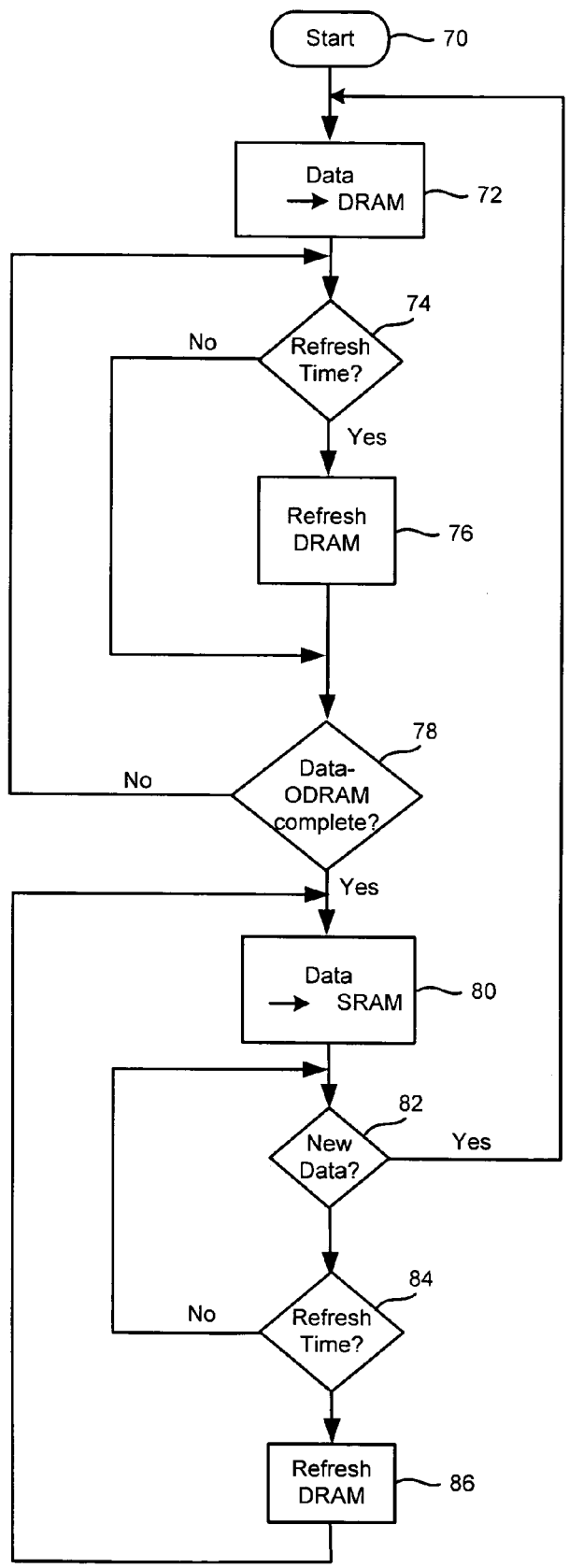
FIG. 5 is a flow chart illustrating an alternative method of operation of the system of FIG. 4.

FIG. 5 is a flow chart illustrating a possible mode of operation of the embodiment of FIG. 4.

This process begins at step 70 and, as before, in step 72 configuration data begins to be downloaded from the external memory device 14 into the DRAM cell 50. Since the time taken to download a complete configuration image may be longer than the time interval that the DRAM can hold its contents without refreshing, it may be necessary to refresh the stored data during this downloading.

Therefore, it is tested in step 74 whether the time period, that the DRAM can hold its contents without refreshing, has expired. If so, the process passes to step 76, and the data stored in the DRAM 50 is refreshed. Thereafter, the process passes to step 78, in which it is determined whether all of the required data has been downloaded into the DRAM 50. If it is determined in step 74 that the time period, that the DRAM can hold its contents without refreshing, has not expired, the process passes from step 74 to step 78, without the data stored in the DRAM 50 being refreshed.

Thus, as mentioned above, in step 78 it is determined whether all of the required data has been downloaded into the DRAM 50. If not, the process returns to step 74 but, when it is determined that all of the required data has been downloaded into the DRAM 50, the process passes to step 80. Under the control of the configuration logic block 18, the switch 52 is closed, and the configuration data stored in the DRAM cell 50 is transferred into the SRAM cell 54. The device is then able to operate on the basis of this data. The time taken to download data from the DRAM 50 to the SRAM 54 should be short enough that it is not necessary to refresh the DRAM during this time. However, it would also be possible to refresh the DRAM 50 during this download, if required.

The process then passes to step 82, in which it is determined whether new configuration data is available to be downloaded into the DRAM cell 50. This test can be carried out by logic in an external processor, or by the configuration logic block 18, or by logic instantiated within the array 22.

If new configuration data is available to be downloaded, the process returns to step 72, as described above. If no new configuration data is available, the process passes to step 84, in which it is determined whether the predetermined refresh time of the DRAM cell has expired. That is, it is again determined whether the predetermined time period has elapsed since the DRAM cell was last refreshed by the refresh circuitry 51. As described with reference to step 74, the predetermined time period is set in accordance with the normal operating characteristics of the DRAM cell, so that the stored data can be maintained in the DRAM cell.

If this predefined refresh time has not expired, then the process returns to step 82, to test again whether new configuration data is available to be downloaded. However, if the predetermined refresh time of the DRAM cell has expired, the process passes to step 86. In step 86 of the process, with the switch 52 having been opened so that the contents of the DRAM cell 50 do not affect the SRAM cell 54, the data stored in the DRAM cell 50 is refreshed by the refresh circuitry 51. The process then passes to step 80, in which the switch 52 is again closed, and the refreshed data stored in the DRAM cell 50 is transferred to the SRAM cell 54, and the process resumes as described above.

This embodiment of the invention has the additional advantage that DRAM memory is much less likely than SRAM memory to be affected by randomly occurring data upsets. That is, in any programmable logic device, in which configuration data is stored in a memory, there is a finite probability that one or more bits of the configuration data will randomly change as a result of one of these upsets, particularly at smaller process geometries. Such a change may then affect the subsequent operation of the programmable logic device. In this case, however, the configuration data stored in the SRAM 54, which is used to determine the functionality of the device, is continually being refreshed from the DRAM device. Since DRAM devices are inherently much less vulnerable to these randomly occurring upsets, any such upset in the SRAM cell 54 will most likely be present for only a short period of time, until the configuration data stored in the SRAM 54 is next refreshed from the DRAM device, and it will therefore have much less effect on the operation of the device.

As described so far, it has been assumed that all of the configuration data will be stored in a configuration memory 16 and in a configuration data store 20, as shown in FIG. 1. However, in embodiments of the invention, it may advantageous to store only a part of the configuration data in this way.

In some applications, some of the configuration data may never be changed. For example the connections between the input/output devices 24, 26 and any external devices are likely to remain unchanged for any particular application. In this case it is not necessary to update the part of the configuration data store 20 that corresponds to these functions. When an update of the functionality is required, only the configuration data that corresponds to the updated area (s) need to be loaded into the configuration memory 16. This would potentially reduce the amount of data that would be needed to be stored and downloaded for the additional applications. However this additional functionality would require extra complexity with respect to how the configuration memory 16 would be addressed. Specifically, areas of the configuration memory 16, such as areas which contain data defining the configuration of the array 22, could be updateable separately from areas which contain data defining the configuration of the input/output devices 24, 26. The advantage of this would be that only the "reduced" configuration bitstream would need to be uploaded into the configuration memory 16 and hence into the configuration data store 20.

Figure 6:
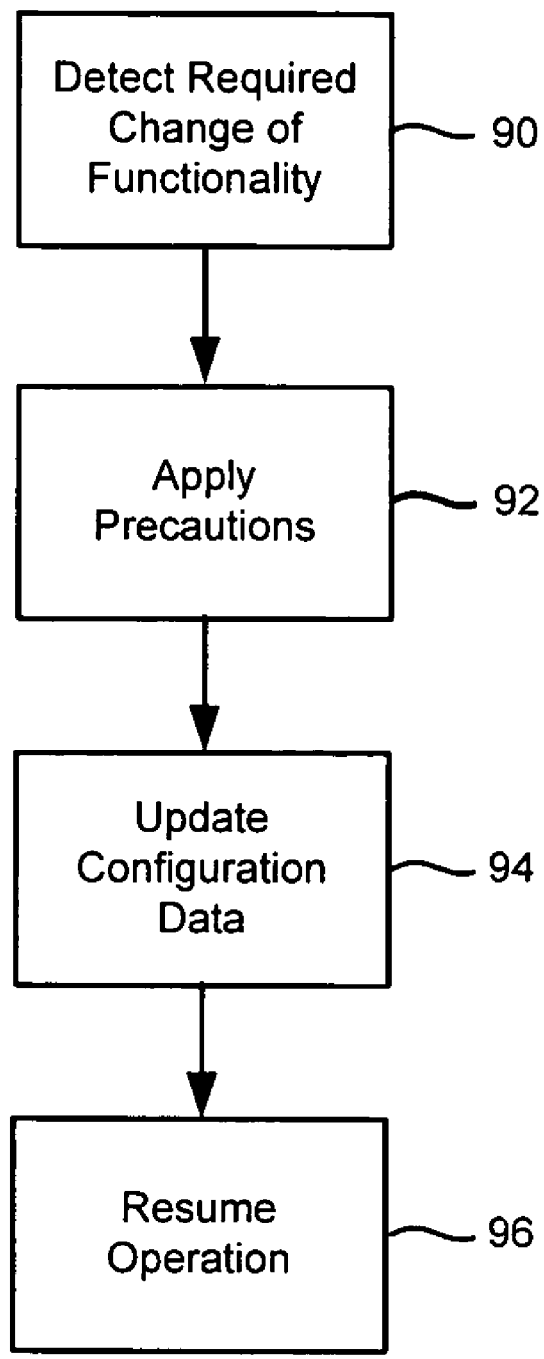
FIG. 6 is a flow chart illustrating an aspect of the operation of the system of FIG. 1.

FIG. 6 is a flow chart illustrating a process for updating a device to change its functionality by changing the operative configuration data. As described below, the device has the modification described above, namely that it is possible to update just a part of the configuration data store 20, but essentially the same process is followed when all of the configuration data store 20 is updated.

This illustrated process begins with step 90, in which it is determined that a change of functionality is required. For example, in the case of a mobile communications device, as described above, it may be determined that the device should begin communications under a different protocol.

In step 92, certain sequences are then performed, in order to ensure that the change of functionality does not cause any problems resulting from data contentions. For example, the switch 42 or 52 between the configuration memory 16 and configuration data store 20 is opened, internal clocks within the device could be stopped to prevent data loss, and internal drivers could be placed in safe state (e.g. tri-state) to prevent contention on the internal signal lines. Also, an external signal could be provided from the configuration logic 18 to indicate to outside devices that a device update operation is taking place. The sequences which are performed could depend on whether some or all of the configuration data store 20 is to be updated.

In step 94, the altered configuration data, relating to the intended changed functionality, is applied to the configuration memory 16, the switch 42 or 52 between the configuration memory 16 and the configuration data store 20 is closed, and the altered configuration data is input to the configuration data store 20 and applied to the programmable logic of the device.

Then, in step 96, the precautions applied in step 92 are removed, and normal operation of the device is resumed, on the basis of the updated configuration data.

Hence, the time taken to update the configuration or function device is reduced.

There is therefore provided a programmable logic device in which updated configuration data can be downloaded, without disrupting the operation of the device.

The invention claimed is:

1. A programmable logic device, comprising:
   a first configuration memory for receiving configuration data from an external memory device, the first configuration memory comprising a DRAM cell wherein the stored configuration data is periodically refreshed;
   a second configuration memory for receiving configuration data stored in the first configuration memory, the second configuration memory comprising an SRAM cell wherein the stored configuration data in the DRAM cell is transferred to the SRAM cell after each refresh of the stored configuration data in the DRAM cell,
   such that the configuration of the programmable logic device is determined by the configuration data stored in the second configuration memory, and such that configuration data can be downloaded from the external memory into the first configuration memory without immediately changing the data stored in the second configuration memory.

2. A programmable logic device as claimed in claim 1, further comprising a configuration logic block, for controlling the transfer of configuration data from the first configuration memory to the second configuration memory.

3. A programmable logic device as claimed in claim 2, further comprising a switch located between the first configuration memory and the second configuration memory, wherein the switch is controllable by said configuration logic block.

4. A programmable logic device as claimed in claim 1, wherein configuration data transferred from the external memory device into the DRAM cell is transferred into the second configuration memory without being refreshed in the DRAM cell.

5. A method of operation of a programmable logic device, the device comprising:
   receiving configuration data from an external memory device to a first configuration memory comprising a DRAM cell;
   transferring the configuration data stored in the first configuration memory to a second configuration memory comprising an SRAM cell;
   periodically refreshing the stored configuration data in the DRAM cell; and
   transferring the stored configuration data in the DRAM cell to the SRAM cell after each refresh of the stored configuration data in the DRAM cell,
   such that the configuration of the programmable logic device is determined by the configuration data stored in the second configuration memory, and configuration data is downloaded from the external memory into the first configuration memory without immediately changing the data stored in the second configuration memory.

6. A method as claimed in claim 5, further comprising controlling the transfer of configuration data from the first configuration memory to the second configuration memory by means of a configuration logic block.

7. A method as claimed in claim 6, further comprising controlling a switch, located between the first configuration memory and the second configuration memory, by means of said configuration logic block.

8. A method as claimed in claim 5, wherein the configuration data received from the external memory device into the DRAM cell is first transferred into the second configuration memory without being refreshed in the DRAM cell.

9. A method as claimed in claim 5, further comprising:
   applying precautions to restrict operation of the device;
   transferring downloaded configuration data from the first configuration memory into the second configuration memory; and
   resuming operation of the device on the basis of the transferred downloaded configuration data.

10. A programmable logic device, comprising:
    a DRAM configuration memory for receiving configuration data from an external memory device, the stored configuration data capable of being periodically refreshed; and
    an SRAM configuration memory for receiving stored configuration data from the DRAM configuration memory, the stored configuration data in the DRAM cell operable to be transferred to the SRAM cell after each refresh of the stored configuration data in the DRAM cell, such that the configuration of the programmable logic device is determined by configuration data stored in the second configuration memory that is refreshed at substantially a periodic refresh rate of the DRAM configuration memory.

11. A method as claimed in claim 10, wherein configuration data is downloaded from the external memory into the DRAM configuration memory without immediately changing the data stored in the SRAM configuration memory.

* * * * *